United States Patent
Mohd Shapee et al.

(10) Patent No.: US 9,168,731 B2
(45) Date of Patent: Oct. 27, 2015

(54) METHOD OF SCREEN PRINTING ON LOW TEMPERATURE CO-FIRED CERAMIC (LTCC) TAPE

(71) Applicant: Telekom Malaysia Berhad, Kuala Lumpur (MY)

(72) Inventors: Sabrina Mohd Shapee, Serdang (MY); Mohd Zulfadli Mohamed Yusoff, Bandar Baru Bangi (MY); Azmi Ibrahim, Bandar Baru Bangi (MY); Rosidah Alias, Kajang (MY); Muhammad Redzuan Saad, Shah Alam (MY); Zulkifli Ambak, Kajang (MY)

(73) Assignee: Telekom Malaysia Berhad, Kuala Lumpur (MY)

( * ) Notice: Subject to any disclaimer, the term of this patent is extended or adjusted under 35 U.S.C. 154(b) by 64 days.

(21) Appl. No.: 14/135,376

(22) Filed: Dec. 19, 2013

(65) Prior Publication Data

US 2014/0174309 A1    Jun. 26, 2014

(30) Foreign Application Priority Data

Dec. 20, 2012   (MY) ........................... PI 2012701229

(51) Int. Cl.
| | |
|---|---|
| B41M 1/12 | (2006.01) |
| B41F 15/44 | (2006.01) |
| B41F 15/00 | (2006.01) |
| B41F 15/26 | (2006.01) |
| B41F 15/36 | (2006.01) |
| B81C 1/00 | (2006.01) |
| H05K 3/12 | (2006.01) |
| H05K 3/46 | (2006.01) |

(52) U.S. Cl.
CPC ................. *B41F 15/44* (2013.01); *B41F 15/00* (2013.01); *B41F 15/26* (2013.01); *B41F 15/36* (2013.01); *B81C 1/00071* (2013.01); *H05K 3/1233* (2013.01); *B41P 2215/50* (2013.01); *H05K 3/4629* (2013.01); *H05K 2203/0139* (2013.01)

(58) Field of Classification Search
CPC .. B41F 15/08; B41F 15/0813; B41F 15/0818; B41F 15/0831; B41F 15/0845; B41F 15/085; B41F 15/44; B41M 1/12; B41P 2215/13; B41P 2215/132
USPC .................................. 101/129, 114, 123, 127
See application file for complete search history.

(56) References Cited

U.S. PATENT DOCUMENTS

| | | |
|---|---|---|
| 4,604,298 A | 8/1986 | Shevtchuk |
| 4,817,524 A | 4/1989 | Riemer |

(Continued)

FOREIGN PATENT DOCUMENTS

| | | |
|---|---|---|
| CN | 101188260 A | 5/2008 |
| CN | 101777413 A | 7/2010 |

*Primary Examiner* — Leslie J Evanisko
(74) *Attorney, Agent, or Firm* — Christensen O'Connor Johnson Kindness PLLC

(57) ABSTRACT

A method of screen printing on low temperature co-fired ceramic (LTCC) is disclosed that comprises the steps of (i) aligning tape position on the printer table of a screen printer machine for precisely positioning the tape relative to the screen mesh of the screen having a plurality of pattern openings; (ii) adjusting screen printing parameter for setting a printing condition, wherein the squeegee speed is adjusted to 50-100 mm/s; squeegee pressure is 0.05-0.wopa15 MPa; and a gap between the screen and the tape is 0.8-1.0 mm; and (iii) optimizing the screen mesh parameter with stainless steel screen mesh, wherein the screen mesh of the screen is optimized at mesh tension of 22-28 N/cm; mesh angle of 22.5°; thickness of an emulsion of 0.044 mm; mesh wire diameter of 0.028 mm; and screen mesh count of 325 apertures per inch.

14 Claims, 3 Drawing Sheets

(56) References Cited

U.S. PATENT DOCUMENTS

| | | |
|---|---|---|
| 5,448,948 A | 9/1995 | Somers |
| 5,699,733 A | 12/1997 | Chang |
| 6,945,167 B2 | 9/2005 | Maeda |
| 7,908,964 B2 | 3/2011 | Yamasaki |
| 7,930,974 B2 | 4/2011 | Nakatani |
| 2012/0242748 A1* | 9/2012 | Katakis et al. .................. 347/44 |

* cited by examiner

METHOD OF SCREEN PRINTING ON LOW TEMPERATURE CO-FIRED CERAMIC (LTCC) TAPE

FIELD

The present disclosure relates to a method for producing a screen print onto a low temperature co-fired ceramic (LTCC) substrate. More particularly, a method of screen printing a silver conductive paste onto an LTCC tape to form a 100 μm line width and a gap spacing for an LTCC system on package (SoP).

BACKGROUND

Screen printing that forms a print film comprising ink, paste, or the like on the surface of a material to be printed using a printing plate (screen mesh) for screen printing can form fine patterns and has high mass-productivity, and hence is utilized in a wide variety of industrial fields.

In the field of electronic part production, a screen printing method may be employed from the points of both precision and mass-productivity. In this field, the demand for forming finer print patterns with high precision has steadily increased due to the recent development of technology to miniaturize the size of the parts.

LTCC is now a popular technology for high-frequency applications used in advantageously preparing 3-D circuits within a ceramic block enabling burying of passive elements such as resistors, inductors, and capacitors. This LTCC approach also allows a number of interfaces and the reduction of the overall substrate size. LTCC technology utilizes highly conductive metal and has a low dielectric constant, low surface roughness, low sintering temperature, and good thermal properties.

Standard screen printing technology has been principally developed for hybrid circuit manufacturing. Hybrid circuits are electronic modules printed on ceramic substrates, a technology in between semiconductor integration and discrete realization on PCB technology, and they are commonly used when electronic modules have to meet high technical requirements. The advantages of screen printing technology are well known: versatility in the conception, miniaturization, and mass production at low cost. The thick film components are produced by screen printing of conductive, resistive, and dielectric layers in order to achieve passive components on an LTCC substrate. Fine line printing is necessary in order to achieve high-component density. Therefore, it is necessary to study the effect of each parameter on printing, which subsequently affects the value of components in the circuit.

In general, screen printing is the basic technology for thick-film microcircuitry. Many variables will affect the screen printing process. The setting of the screen printer is a manual operation, and the quality of screen printed thick film strongly depends on the operator and the process variables. The parameter setting is essential to ensure the desired thickness and the uniformity of the pastes printed on the tape.

U.S. Pat. No. 6,945,167 discloses a screen printing apparatus and method in that in the print parameter setting process for setting print parameters including a squeegee movement speed, a printing pressure, and plate release conditions, a squeegee movement speed at which the squeegee is to be moved is set at the first step, then a printing pressure for realizing a desired cream solder charging state is set at the second step, and then plate release conditions for realizing a desired cream solder transfer state is set at the third step. It does not mention firing, baking, or heating of ceramic printed board, and there is no mention of LTCC or green tape.

U.S. Pat. No. 4,817,524 discloses a method of the present disclosure applicable to a screen printing method for applying an ink to a substrate by placing a screen over the substrate, drawing a squeegee that includes a contact edge over the screen in a flood stroke such that a layer of ink is deposited on the screen, and then drawing the squeegee over the screen in a print stroke with the contact edge in contact with the screen such that ink is forced through the screen onto the substrate. It does not mention LTCC or ceramic printed board.

U.S. Pat. No. 5,699,733 discloses a process that requires firing at low temperature, i.e., 500-600° C. However, the process is directed to increase paste layer thickness by subsequent repeated layering up to 6 layers. There is no mention of 3-D circuit or interconnecting circuit layers as in an LTCC process.

U.S. Pat. No. 5,448,948 discloses a screen printing device for screen printing a thick film ink through a screen so as to form a substantially void-free film on a surface of a microelectronics circuit. It is limited to squeegee design.

U.S. Pat. No. 4,604,298 is directed to the viscosity of conductive ink compound, a high-viscosity gold alloy, firing at 800-900° C. However, there is no mention of ceramics and no mention of 3-D circuitry or embedding of components.

U.S. Pat. No. 7,930,974 discloses vacuum suction holes for affixing an object to be printed. There is no mention of green tape or ceramic being made. Baking is disclosed for electrode material to form electrodes.

U.S. Pat. No. 7,908,964 discloses specifically to the clearance gap between mask and substrate. There is no mention of ceramic firing, baking, or application for green tape.

Chinese Patent No. 101188260 discloses LTCC process for fabricating a square or circular cavity as a base for a high-powered LED to be formed on the LTCC layer prior to screen-printing. There is no mention of any process control parameters for screen printing.

Chinese Patent No. 101777413 discloses a process for forming an LTCC power inductor comprising ferrite magnetic core and mentions the advantages of high-frequency ceramic material and thinner (finer or higher resolution) screen print lines besides other benefits such as less conductor loss, low dielectric constant, better coefficient of heat conductivity and better exothermic property. The process control parameters disclosed here are applicable for a very specific type of device, i.e., for an LTCC power inductor.

SUMMARY

The present disclosure provides a method of screen printing on LTCC that improves the quality of fine line printing resolution.

The method of screen printing in the present disclosure enhances the performance of the LTCC circuit application, and the method of screen printing with varying screen mesh tension, mesh angle, emulsion thickness, wire diameter, and mesh count affects the printing quality.

The present disclosure provides a method of screen printing on LTCC, wherein the screen printing parameter with optimization of screen mesh for LTCC processing can be controlled and fixed and the method can be used to print 100 μm line width by using a silver conductor.

The present disclosure provides a method of screen printing on LTCC, wherein the line width and gap spacing 100 μm is able to cover microwave frequency up to 60 GHz.

The present disclosure provides a method of screen printing on LTCC to enhance the high-frequency performance and minimize loss of the LTCC SoP by using the compatible parameter for screen printing the LTCC tape.

The present disclosure provides a method of screen printing on LTCC to obtain a solution to screen print a transmission line onto an LTCC tape for the resolution of 100 µm line width and gap spacing.

The present disclosure provides a method of screen printing on LTCC comprising the steps of (i) aligning tape position on the printer table for precisely positioning the tape relative to the screen mesh having pattern openings; (ii) adjusting the screen printing parameter for setting a printing condition, wherein the squeegee speed is adjusted to 50-100 mm/s, squeegee pressure is 0.05-0.15 MPa; and a gap between screen and tape (snap-off) is 0.8-1.0 mm; and (iii) optimizing a screen mesh parameter with stainless steel screen mesh, wherein the screen mesh is optimized at mesh tension of 22-28 N/cm.

The present disclosure provides a method of screen printing on LTCC comprising the steps of (i) aligning tape position on the printer table for precisely positioning the tape relative to the screen mesh having pattern openings; (ii) adjusting the screen printing parameter for setting a printing condition, (iii) rheological measuring of a silver conductor used for the printing process; and (iv) optimizing a screen mesh parameter with stainless steel screen mesh, wherein the printing parameters are set as squeegee speed of 50-100 mm/s; squeegee pressure of 0.05-0.15 MPa; and the gap between screen and tape (snap-off) is 0.8-1.0 mm; the screen mesh parameters are optimized as mesh tension of 22-28 N/cm; mesh angle of 22.5°, thickness of the emulsion applied on the screen mesh of 0.044 mm; mesh wire diameter of 0.028 mm; and screen mesh count of 325 apertures per inch.

DESCRIPTION OF THE DRAWINGS

The present disclosure will become more fully understood when considered in conjunction with the accompanying drawings, which are provided by way of illustration and thus are not meant to be considered in a limiting sense, and wherein.

DETAILED DESCRIPTION OF THE INVENTION

Embodiments of the present disclosure will be explained below. It will be understood that the present disclosure is not limited to the embodiments, and various changes and improvements may be made based on the common knowledge of those skilled in the art within the principles and scope of the disclosure.

Figure 1:
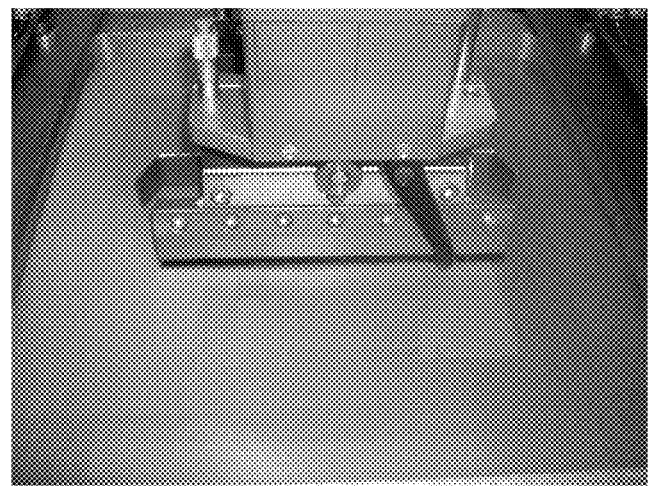
FIG. 1 depicts a screen printing machine (KEKO P-200Avf) used in the method of screen printing on LTCC in accordance with the present disclosure.

FIG. 1 is a screen printing machine that is used to transfer the desired pattern, module, or design of any circuit onto Low Temperature Co-fired Ceramic (LTCC) tape. It is employed in a method of screen printing on LTCC tape in accordance with the present disclosure. As is well known, the LTCC technology can be defined as a way to produce multilayer circuits with the help of single tapes, which are used to apply conductive, dielectric, and/or resistive pastes. These single sheets have to be laminated together and fired in one step. This saves time and money and reduces circuits' dimensions. Because of the low firing temperature of about 850° C., it is possible to use the low resistive materials, such as silver and gold, instead of molybdenum and tungsten.

Figure 2:
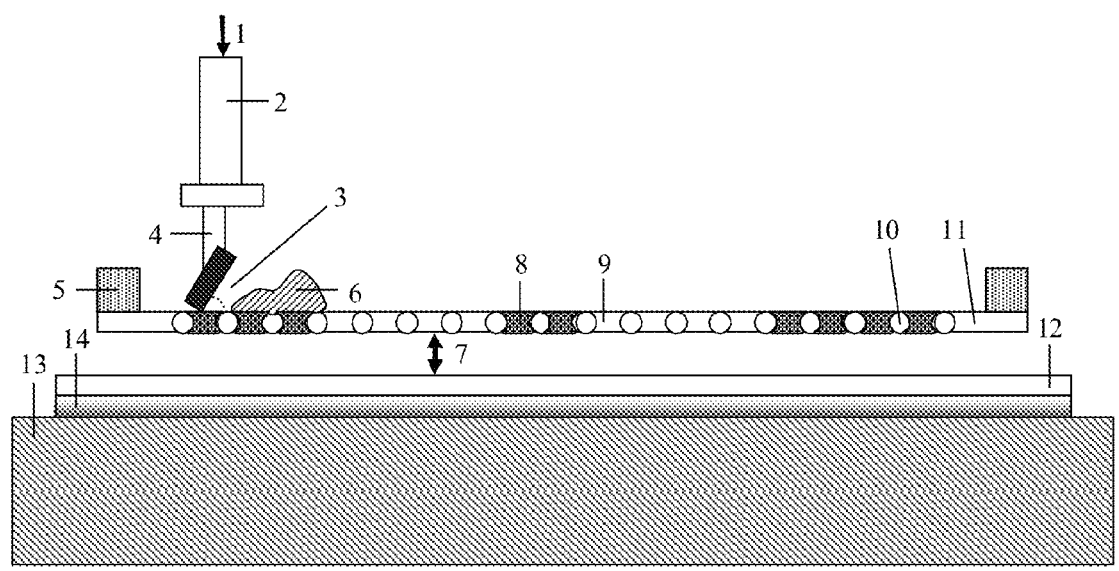
FIG. 2 is a schematic view of the screen printing machine of FIG. 1 showing a screen printing process in accordance with the present disclosure.

FIG. 2 is a schematic view of the screen printing machine of FIG. 1 as shown. The type of screen printing machine for the method of the present disclosure comprises: a base assembly or a printing table 13; at least one print station including a support suitable for receiving a screen 11; and means for moving the support. The screen 11 comprises a frame 5, a mesh 10, and a squeegee head 2 that is moveable along the support. The mesh 10 is usually made from stainless steel. The process starts with the designing procedures. During this stage, the design engineer will design and simulate the desired module or pattern using LTCC designing software such as EMPIRE and MultiLib. The design layout is then generated into film artwork for each layer to be printed. The artwork is then transferred onto the bottom side of the screen 11 by a photosensitive emulsion 8 and exposed to a UV light that will produce a screen 11 with pattern openings 9 that consists of the area to be printed. The generated screen 11 is positioned in the screen printing machine parallel to the printing table 13. Paste 6 is placed on the screen 11 and a tape 12 is placed directly under the screen 11. A squeegee 4 is directed across the screen 11 at a predetermined angle 3, speed 15, and pressure 1. Another parameter that needs to be set before the printing process is the snap-off 7. When the tape 12 with a mylar carrier 14 is loaded on the printing table 13, the vision alignment is done to ensure the alignment of the tape 12 and the pattern 9 on the screen 11, so that the pattern 9 will be printed on the accurate place as designed. This is very necessary especially for a multilayer module. The printing process is then carried out when all the parameter settings and vision alignment are completed.

Figure 3:
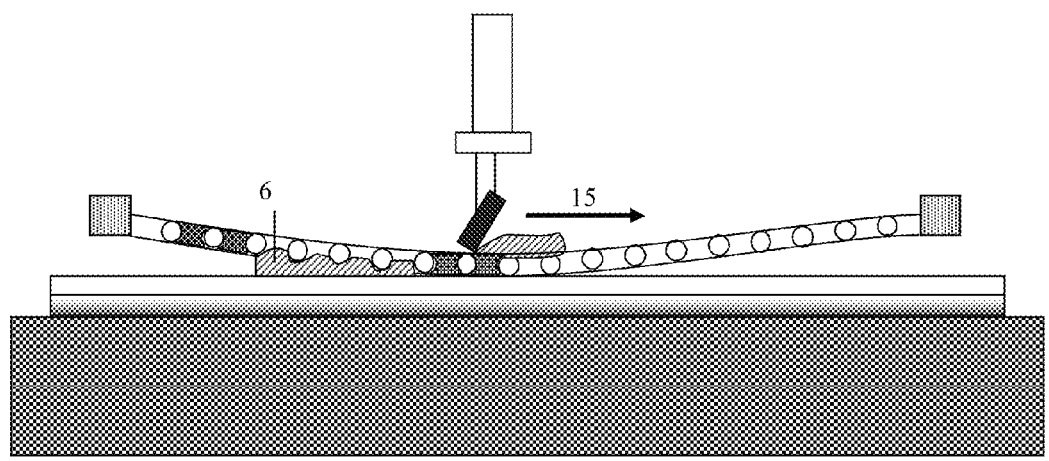
FIGS. 3 and 4 illustrate a screen printing process in accordance with an embodiment of the present disclosure.
Figure 4:
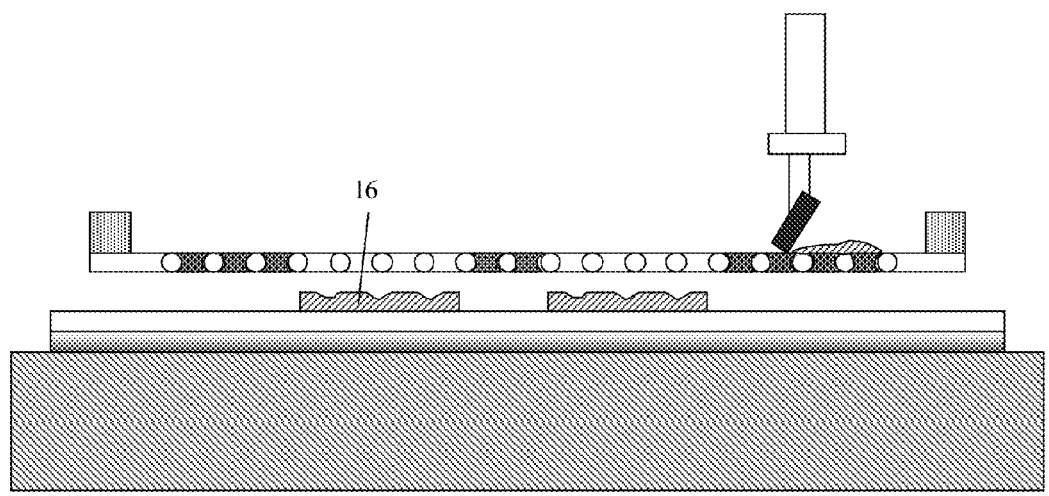

FIGS. 3 and 4 illustrate the screen printing process in accordance with an embodiment of the present disclosure. The screens 11 used for printing conductive paste 6, such as silver paste 6, for LTCC are a mesh 10 structure woven from fine stainless steel wire, and the parts of the printer machine other than the pattern openings 9 are covered with emulsion 8.

As shown in FIG. 2, in the screen printing process of the present method, a quantity of silver conductor paste 6 is placed on the screen 11 of the screen printing machine. The squeegee 4 pushes the paste 6 on the screen 11 through the openings 9 of the mask frame 5 such that the paste 6 is applied to the tape 12. Referring to FIG. 4, when the paste 16 is applied to the tape 12, the screen 11 is released from contact with the paste 6. For repeating of the steps, the squeegee pressure 1 that is applied to the squeegee head 2 in accordance with the present disclosure remains constant throughout the process, and therefore the travel of the squeegee head 2 must be parallel to the tape 12, and the pressure 1 applied must be uniform onto the tape 12 across the width.

Figure 5:
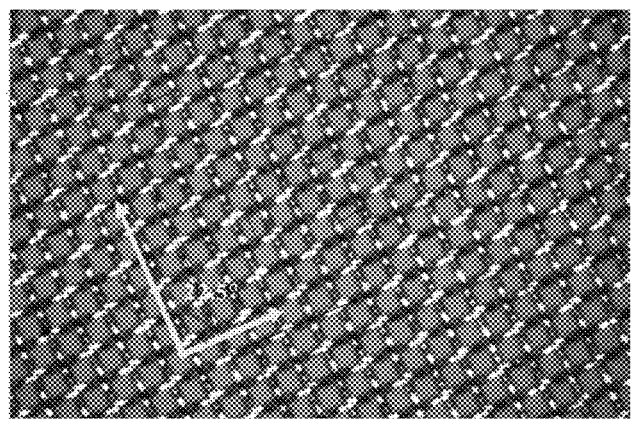
FIG. 5 shows a screen mesh wire diameter with an angle of 22.5° in accordance with the present disclosure.

FIG. 5 shows the mesh wire 10 used in the method of screen printing of the present disclosure. In accordance with the present invention, the mesh angle is oriented in the range of 22°-45° to the frame 5, preferably 22.5° to prevent the partial blocking of the opening on one side of the trace by the screen wire.

In accordance with the present disclosure, the method of screen printing is carried out based on the steps below: (i) The tape 6 on the printing table 13 of the screen printing machine is aligned to precisely position the tape 6 relatively to the screen mesh 10 having a plurality of pattern openings 9. (ii) The screen printing parameter for setting the printing condition is adjusted based on the table that follows:

Printing Parameters:

| | |
|---|---|
| Squeegee pressure | 0.05-0.15 MPa |
| Squeegee speed | 50-100 mm/s |
| Snap-off | 0.8-1.0 mm |

(iii) A rheological measurement of silver conductor paste 6 is used for the printing process. (iv) The screen mesh 10 parameter with stainless steel screen mesh 10 is optimized based on the following table:

Screen Mesh 10 Parameters:

| | |
|---|---|
| Mesh angle | 22.5° |
| Mesh tension | 22-28 N/cm |
| Emulsion thickness | 0.044 mm |
| Wire diameter | 0.028 mm |
| Mesh count | 325 |

(v) An inspection step is employed to inspect the line width resolution and gap spacing.

In operation, a quantity of a conductor paste 6 (for example, silver paste) is placed on the screen 11. The squeegee 4 of the squeegee head 2 pushes the paste 6 through a plurality of openings of the mask frame 5. As shown in FIG. 3, the paste 6 is applied to the tape 12. At the same time, the screen 11 is released from the contact with the paste 6. For repeatability, the squeegee pressure 1 that is applied in accordance with the present disclosure remains constant throughout the process, and therefore the travel of the squeegee head 2 must be parallel to the tape 12. The squeegee pressure 1 has an impact on the effective angle of attack 3, which is the angle between the leading edge of the squeegee 4 and tape surface 12 as shown in FIG. 3 and also affects the snap-off distance 7 to be overcome if the low squeegee pressure 1 was applied in the printing process of the present disclosure.

As shown in FIG. 3, a squeegee speed 15 is the speed of the moving means for moving the squeegee 4 in a horizontal direction of the screen printing machine. A plate separation or snap-off 7 means a gap between the screen 11 and the tape 12. The snap-off distance 7 is also called the off-contact distance, being necessary during printing in order to keep the screen 11 from adhering to the tape 12.

In accordance with the present disclosure, the fixed screen printing parameters used in the present method are as follows:

Printing Parameters:

| | |
|---|---|
| Squeegee pressure | 0.05-0.15 MPa |
| Squeegee speed | 50-100 mm/s |
| Snap-off | 0.8-1.0 mm |

Figure 6:
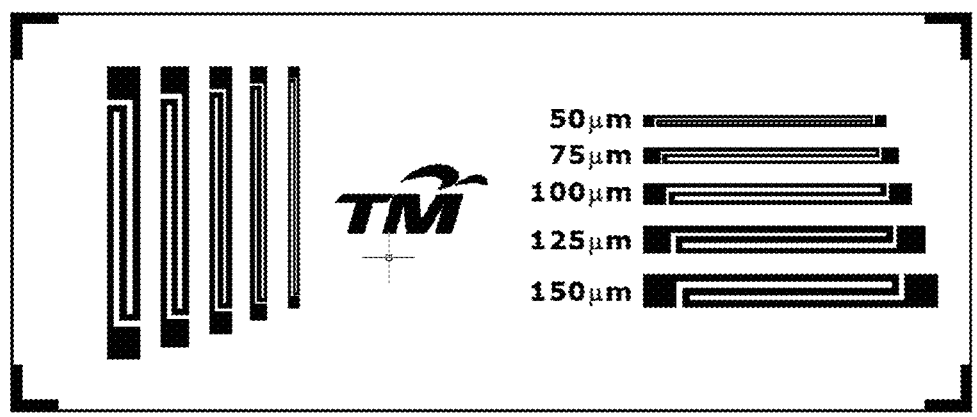
FIG. 6 is a test pattern for line resolution with different line width and line spacing in accordance with the present disclosure.

The inspection step is made to check the line resolution of the printed pattern 16, as shown in FIG. 4. FIG. 6 shows the test patterns for the line resolution. The test patterns have five lines of resolution with different widths and gap spacing. Each line width has three lines with the same gap spacing. The line width and spacing is designed in the position of the horizontal and vertical line at different widths which are 50 µm, 75 µm, 100 µm, 125 µm, and 150 µm. The test pattern is evaluated using an optical microscope before and after the co-firing process. The line width measurement is considering the shrinkage of LTCC tape by calculating the expansion factor 0.17% from the actual design as stated below:

| Line/Spacing (µm) | Line (µm) | Spacing (µm) |
|---|---|---|
| 50 | 58.5 | 58.5 |
| 70 | 87.7 | 87.8 |
| 100 | 117.0 | 117.0 |
| 125 | 146.3 | 146.3 |
| 100 | 175.5 | 175.5 |

Figure 7:
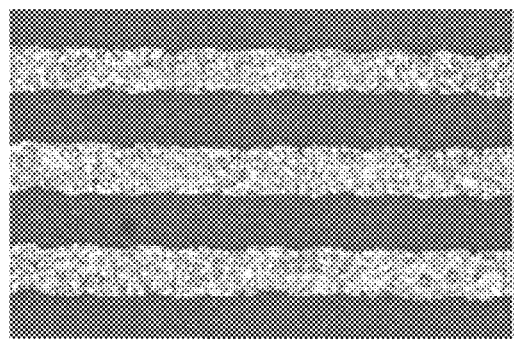
FIG. 7 is an image of 100 µm line resolution in accordance with the present disclosure.

The evaluation results show a minimum line and dimension of 100 µm as shown in FIG. 7. The printed patterns 16 obtained in accordance with the method of the present disclosure are clearly defined and good line resolution and spacing deviations are nearly +10-15 µm.

The present disclosure being thus described, it will be obvious that the same may be varied in many ways. Such variations are not to be regarded as a departure from the spirit and scope of the present disclosure, and all such modifications as would be obvious to one skilled in the art are intended to be included within the scope of the following claims.

The invention claimed is:

1. A method of screen printing a printed pattern of silver paste material on a low temperature co-fired ceramic (LTCC) tape, comprising the steps of:
    (i) providing a screen printing machine including a printer table, a screen mesh having pattern openings positioned adjacent the printer table, and a squeegee;
    (ii) aligning a position of the LTCC tape on the screen table for precisely positioning the LTCC tape relative to the screen mesh having pattern openings; the LTCC tape being positioned such that there is a gap between the screen and tape;
    (iii) adjusting screen printing parameters for setting a printing condition, the printing parameters being set as a squeegee speed of 50-100 mm/s; a squeegee pressure of 0.05-0.15 MPa, and the gap between the screen and tape (snap-off) of 0.8-1.0 mm;
    (iv) optimizing screen mesh parameters, the screen mesh being a stainless steel screen mesh, the screen mesh being optimized at a tension of 22-28 N/cm;
    (v) depositing the silver paste material on the screen mesh; and
    (vi) directing the squeegee across the screen mesh at the set speed and pressure to push the silver paste material through the pattern openings in the screen mesh to print a pattern of the silver paste material on the LTCC tape.

2. The method of screen printing of claim 1, wherein the step of optimizing the screen mesh parameters includes setting a mesh angle of the screen to 22.5°.

3. The method of screen printing of claim 1, wherein the step of optimizing the screen mesh parameters includes setting a thickness of an emulsion applied on the screen mesh to 0.044 mm.

4. The method of screen printing of claim 1, wherein the step of optimizing the screen mesh parameters includes setting a mesh wire diameter of the screen mesh to 0.028 mm.

5. The method of screen printing of claim 1, wherein the step of optimizing the screen mesh parameters includes setting a screen mesh count of the screen mesh to 325 apertures per inch.

6. The method of screen printing of claim 1, further comprising the step of rheological measuring of the silver paste material.

7. The method of screen printing of claim 6, wherein the step of optimizing the screen mesh parameters includes setting a mesh angle of the screen mesh is to 22.5°.

8. The method of screen printing of claim 7, wherein the step of optimizing the screen mesh parameters further includes setting a thickness of an emulsion applied on the screen mesh to 0.044 mm.

9. The method of screen printing of claim 7, wherein the step of optimizing the screen mesh parameters further includes setting a mesh wire diameter of the screen mesh to 0.028 mm.

10. The method of screen printing of claim 7, wherein the step of optimizing the screen mesh parameters further includes setting a screen mesh count of the screen mesh to 325 apertures per inch.

11. The method of screen printing of claim 6, further comprising the step of inspecting line width resolution and gap spacing of the printed pattern.

12. The method of screen printing of claim 1, further comprising the step of inspecting line width resolution and gap spacing of the printed pattern.

13. A method of screen printing a printed pattern of a silver paste material on a low temperature co-fired ceramic (LTCC) tape, comprising the steps of:
    (i) providing a screen printing machine including a printer table, a screen mesh having pattern openings positioned adjacent the printer table, and a squeegee;
    (ii) aligning a position of the LTCC tape on the screen table for precisely positioning the LTCC tape relative to the screen mesh having the pattern openings; the LTCC tape being positioned such that there is a gap between the screen and tape;
    (iii) adjusting screen printing parameters for setting a printing condition, the printing parameters being set as a squeegee speed of 50-100 mm/s; a squeegee pressure at 0.05-0.15 MPa; and the gap between the screen and tape (snap-off) at 0.8-1.0 mm;
    (iv) optimizing screen mesh parameters, the screen mesh being a stainless steel screen mesh, the screen mesh being optimized at a tension of 22-28 N/cm, a mesh angle of 22.5°, an emulsion thickness of 0.044 mm, a mesh wire diameter of 0.028 mm, and a screen mesh count of 325 apertures per inch;
    (v) rheological measuring of the silver paste material;
    (vii) depositing the silver paste material on the screen mesh; and
    (vii) directing the squeegee across the screen mesh at the set speed and pressure to push the silver paste material through the pattern openings in the screen mesh to print a pattern of the silver paste material on the LTCC tape.

14. A method of screen printing a printed pattern of a silver paste material on a low temperature co-fired ceramic (LTCC) tape, comprising the steps of:
    (i) providing a screen printing machine including a printer table, a screen mesh having pattern openings positioned adjacent the printer table, and a squeegee;
    (ii) aligning a position of the LTCC tape on the screen table for precisely positioning the LTCC tape relative to the screen mesh having the pattern openings, the LTCC tape being positioned such that there is a gap between the screen and tape;
    (iii) adjusting screen printing parameters for setting a printing condition, the printing parameters being set as a squeegee speed of 50-100 mm/s, a squeegee pressure of 0.05-0.15 MPa, and the gap between the screen and tape (snap-off) of 0.8-1.0 mm;
    (iv) optimizing screen mesh parameters, the screen mesh being a stainless steel screen mesh, the screen mesh being optimized at a tension of 22-28 N/cm, a mesh angle of 22.5°, an emulsion thickness of 0.044 mm, a mesh wire diameter of 0.028 mm, and a screen mesh count of 325 apertures per inch;
    (v) rheological measuring of the silver paste material;
    (vi) depositing the silver paste material on the screen mesh;
    (vii) directing the squeegee across the screen mesh at the set speed and pressure to push the silver paste material through the pattern openings in the screen mesh to print a pattern of the silver paste material on the LTCC tape; and
    (viii) employing an inspection process for inspecting line width resolution and gap spacing of the printed pattern.

\* \* \* \* \*